US012805357B2

(12) United States Patent
Pendse

(10) Patent No.: US 12,805,357 B2
(45) Date of Patent: Nov. 17, 2026

(54) UNIVERSAL CHIP WITH VARIABLE PACKAGING

(71) Applicant: Meta Platforms Technologies, LLC, Menlo Park, CA (US)

(72) Inventor: Rajendra D Pendse, Fremont, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 353 days.

(21) Appl. No.: 18/534,143

(22) Filed: Dec. 8, 2023

(65) Prior Publication Data

US 2024/0312892 A1 Sep. 19, 2024

Related U.S. Application Data

(60) Provisional application No. 63/490,501, filed on Mar. 15, 2023.

(51) Int. Cl.
*H10W 70/65* (2026.01)
*H10W 90/00* (2026.01)

(52) U.S. Cl.
CPC ........... *H10W 70/65* (2026.01); *H10W 90/00* (2026.01); *H10W 90/724* (2026.01); *H10W 90/725* (2026.01); *H10W 90/794* (2026.01)

(58) Field of Classification Search
CPC .... H10W 90/00; H10W 90/701; H10W 70/65
See application file for complete search history.

(56) References Cited

U.S. PATENT DOCUMENTS

2019/0326272 A1* 10/2019 Wilkerson .............. H10P 72/74
2024/0274587 A1* 8/2024 Pendse .................... H10B 80/00
2024/0371780 A1* 11/2024 Huang .................. H10W 42/00
2025/0118697 A1* 4/2025 Chang ................... H10W 40/10
2025/0293114 A1* 9/2025 Yu ........................... H10P 72/74

* cited by examiner

*Primary Examiner* — Britt Hanley
*Assistant Examiner* — Jason James Greaving
(74) *Attorney, Agent, or Firm* — McDermott Will & Schulte LLP

(57) ABSTRACT

Apparatuses include a package substrate with package bonding pads and a die electrically coupled to the package substrate via conductive bonding elements. The die includes a first application-specific integrated circuit (ASIC) with first die input/output pads and a second ASIC with second die input/output pads. Each of the first die input/output pads is electrically coupled to at least one corresponding package bonding pad. At least one of the second die input/output pads is not electrically coupled to any package bonding pad, such that the second ASIC is left in an inoperable state.

20 Claims, 13 Drawing Sheets

UNIVERSAL CHIP WITH VARIABLE PACKAGING

CROSS REFERENCE TO RELATED APPLICATION

This application claims the benefit of U.S. Provisional Patent Application No. 63/490,501, filed 15 Mar. 2023, the disclosure of which is incorporated, in its entirety, by this reference.

BRIEF DESCRIPTION OF THE DRAWINGS

The accompanying drawings illustrate a number of example embodiments and are a part of the specification. Together with the following description, these drawings demonstrate and explain various principles of the present disclosure.

Figure 1:
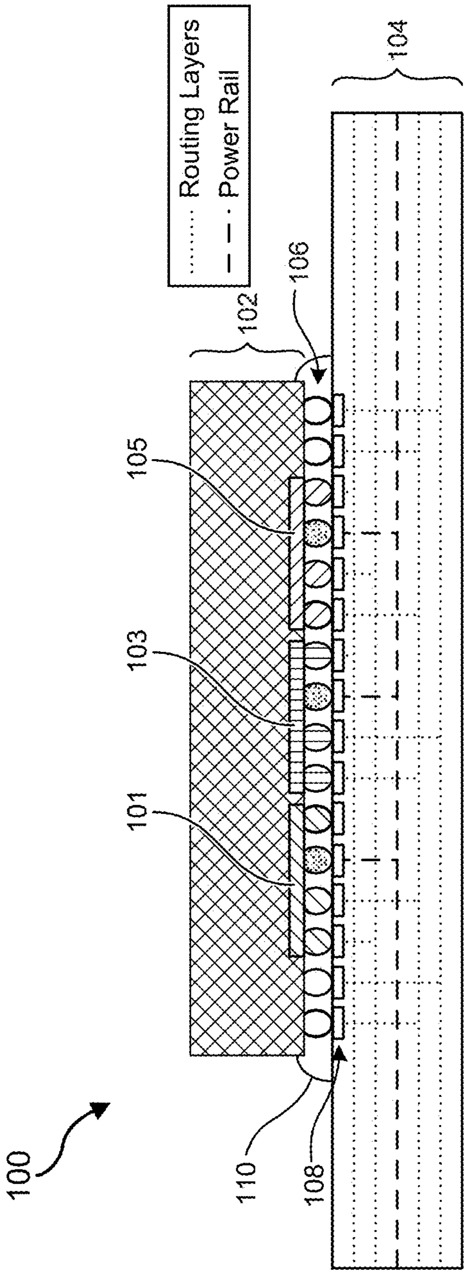
FIG. 1 is an illustration of an example packaging configuration of a universal chip, according to at least one embodiment of this disclosure.

Throughout the drawings, identical reference characters and descriptions indicate similar, but not necessarily identical, elements. While the example embodiments described herein are susceptible to various modifications and alternative forms, specific embodiments have been shown by way of example in the drawings and will be described in detail herein. However, the example embodiments described herein are not intended to be limited to the particular forms disclosed. Rather, the present disclosure covers all modifications, equivalents, and alternatives falling within the scope of this disclosure.

DETAILED DESCRIPTION OF EXAMPLE EMBODIMENTS

The present disclosure is generally directed to universal chips (e.g., semiconductor chips) with variable packaging. In some embodiments, a universal system-on-chip (SoC) having multiple functional blocks/application-specific integrated circuits (ASICs) may be configured to have each of its multiple functional blocks/ASICs individually couplable to a package substrate. For example, a universal SoC may be manufactured such that each of its multiple ASICs has die pads that may be used to couple the ASICs (e.g., via a fan-out wafer-level packaging process or a wafer bumping process such as solder bumping, copper pillar bumping, or under bump metallization (UBM)) to corresponding bonding pads of a package substrate.

According to some embodiments of the present disclosure, different configurations of redistribution or bumping layers may be used to turn off or merge functional units in an SoC chip without changing the chip and/or without needing to integrate switches into the SoC chip for these functions, which may result in cost and space savings. In at least one example, a technique of depopulating die bumps may be used to disconnect sense lines to desired locations and/or disconnect power to eliminate power consumption by unneeded functional units. Advantages of the disclosed techniques may include not needing any on-die features to switch off functional blocks and, because there may be no physical power connections, little to no power leakage from those unused functional blocks.

In some examples, when a universal SoC is used for different use cases (e.g., use cases that do not use each of the universal SoC's existing multiple functional blocks or ASICs), one or more of the disclosed packaging configurations may be used to turn off, deactivate, or otherwise make inoperable one or more of the unused functional blocks and/or ASICs.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-4, detailed descriptions of example packaging configurations for a universal chip. With reference to FIGS. 5-13, the following will provide detailed descriptions of various extended-reality systems and components that may implement embodiments of the present disclosure.

FIG. 1 is a diagram of an example package 100 for an example universal chip 102 in which universal chip 102 is electrically coupled to an example package substrate 104 via conductive bonding elements (e.g., bumps 106, such as solder bumps, copper pillar bumps, etc.). A dielectric underfill material 110 may be positioned in a space between universal chip 102 and package substrate 104, and laterally between bumps 106 to mechanically secure universal chip 102 to package substrate 104 and to electrically isolate bumps 106 from each other.

As shown, universal chip 102 may include multiple functional blocks/ASICs. For example, universal chip 102 may include a graphics block 101, a machine-learning block 103, and/or a display block 105. In some examples, each of the multiple functional blocks/ASICs of universal chip 102 may be configured to perform different functions. Alternatively, two or more of the multiple functional blocks/ASICs of universal chip 102 may be configured to perform the same and/or substantially the same function.

As shown in FIG. 1, package substrate 104 may include various routing layers and/or power rails. In some examples, one or more of the various routing layers and power rails of package substrate 104 may electrically couple one or more connecting/bonding pads 108 on a top side of package substrate 104 to corresponding I/O pins (e.g., a ball grid array) on a bottom side of package substrate 104. Additionally or alternatively, one or more of the various routing layers and power rails of package substrate 104 may electrically couple one or more connecting/bonding pads 108 on the top side of package substrate 104 to one or more other connecting/bonding pads on the top side of package substrate 104.

Figure 3:
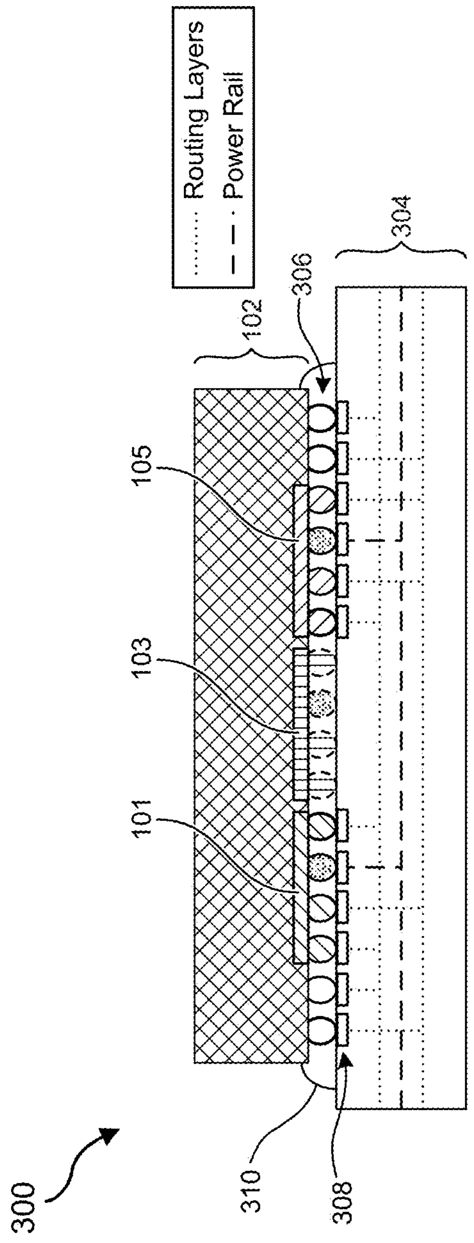
FIG. 3 is an illustration of an example packaging configuration of the universal chip illustrated in FIG. 1, according to at least one embodiment of this disclosure.
Figure 4:
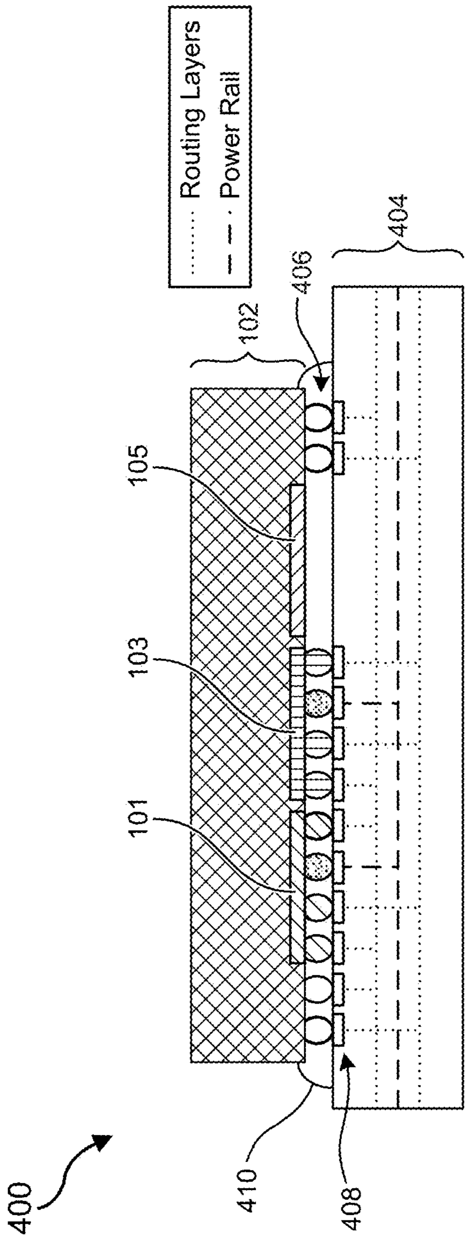
FIG. 4 is an illustration of another example packaging configuration of the universal chip illustrated in FIG. 1, according to at least one embodiment of this disclosure.

With some use cases, each of the multiple functional blocks/ASICs of universal chip 102 may be utilized and/or needed. In such use cases, each of the multiple functional blocks/ASICs of universal chip 102 may be activated by electrically coupling each of the multiple functional blocks/ASICs to package substrate 104 (e.g., as illustrated in FIG. 1). With other use cases, one or more of the multiple functional blocks/ASICs of universal chip 102 may not be utilized and/or needed. In such use cases, the utilized and/or needed functional blocks/ASICs of universal chip 102 may be activated by electrically coupling them to package substrate 104 while the unutilized and/or unneeded functional blocks/ASICs of universal chip 102 may be deactivated by refraining from electrically coupling them to package substrate 104 (e.g., as illustrated in FIGS. 2-4).

In some embodiments, different or variable bump masks may be used to decouple/couple universal chip 102 relative to package substrate 104 to enable different configurations/activations of multiple functional blocks/ASICs of universal chip 102. For example, different or variable bump masks may be used to form different configurations or sets of bumps 106 onto universal chip 102 that result in different configurations/activations of multiple functional blocks/ASICs of universal chip 102 when universal chip 102 is coupled to a package substrate. In some embodiments, bump formation may be performed as part of a packaging process and/or at a wafer level.

Figure 2:
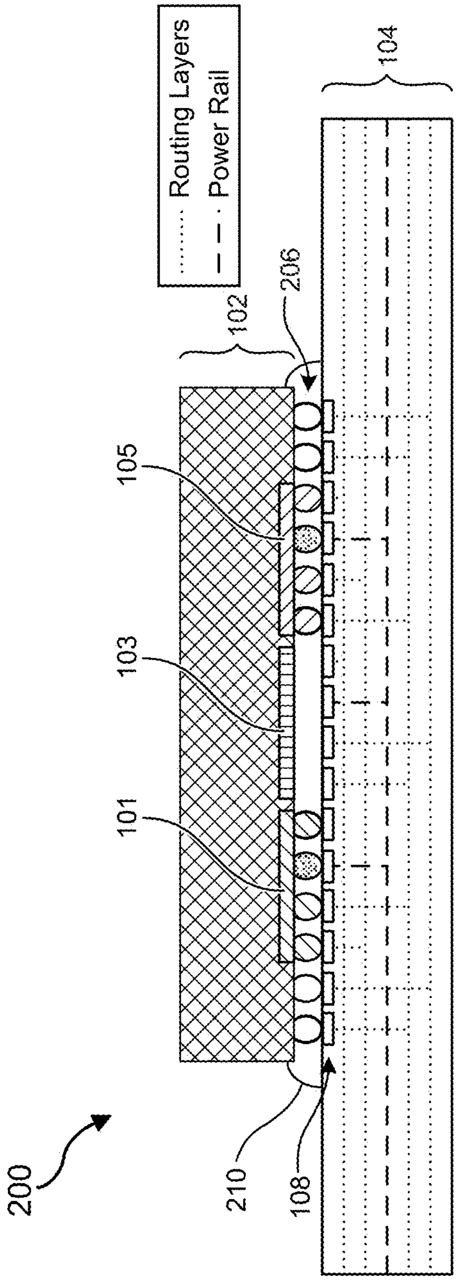
FIG. 2 is an illustration of an example packaging configuration of the universal chip illustrated in FIG. 1, according to at least one embodiment of this disclosure.

FIG. 2 is a diagram of another example packaging configuration 200 for example universal chip 102 in which less than all of the multiple functional blocks/ASICs of universal chip 102 are electrically coupled to package substrate 104 via conductive bonding elements (e.g., bumps 206). A dielectric underfill material 210 may be positioned in a space between universal chip 102 and package substrate 104, and laterally between bumps 206 to mechanically secure universal chip 102 to package substrate 104 and to electrically isolate bumps 206 from each other.

As shown in this example, graphics block 101 and display block 105 may be electrically coupled to package substrate 104 (e.g., through bonding pads 108 on package substrate 104) while machine-learning block 103 may not be electrically coupled to package substrate 104. In some examples, machine-learning block 103 may be completely electrically decoupled from package substrate 104 (e.g., no bumps that electrically couple machine-learning block 103 to package substrate 104 may be provisioned (e.g., as shown in FIG. 2). Alternatively, machine-learning block 103 may be partially decoupled from package substrate 104. For example, a bond pad of universal chip 102 configured to deliver power to machine-learning block 103 may not be electrically coupled to package substrate 104. In another example, a bond pad of universal chip 102 configured to relay a voltage level of machine-learning block 103 to a power management chip may not be electrically coupled to package substrate 104, which may improve the integrity of other relayed voltage levels.

FIGS. 3 and 4 illustrate example packaging configurations 300 and 400 for universal chip 102 that use package substrates customized for particular use cases (e.g., use cases that do not need machine-learning block 103 or display block 105, respectively). In some examples, the customized package substrates may be thinner as a result of having fewer routing layers and/or power rails. For example, package substrate 304 may be customized for the use case illustrated in FIG. 3, and package substrate 404 may be customized for the use case illustrated in FIG. 4. Depending on the complexity of a functional block of universal chip 102 being disconnected, the number of routing layers/power rails in a customized package substrate may be substantially reduced, making the substrate physically smaller and/or thinner (e.g., because there may be less I/O connected to universal chip 102).

FIG. 3 is a diagram of an example packaging configuration 300 for example universal chip 102 in which less than all of the multiple functional blocks/ASICs of universal chip 102 are electrically coupled to package substrate 304 via conductive bonding elements (e.g., bumps 306) and bonding pads 308 on package substrate 304. A dielectric underfill material 310 may be positioned in a space between universal chip 102 and package substrate 304, and laterally between bumps 306 to mechanically secure universal chip 102 to package substrate 304 and to electrically isolate bumps 306 from each other.

As shown in this example, graphics block 101 and display block 105 may be electrically coupled to package substrate 304, while machine-learning block 103 may not be. In some examples, machine-learning block 103 may be completely electrically decoupled from package substrate 304 (e.g., no bumps 306 that couple machine-learning block 103 to package substrate 304 may be provisioned and/or package substrate 304 may not include 1/O pads, routing layers, or power rails to which machine-learning block 103 could be electrically coupled even with suitable bumps 306). Alternatively, machine-learning block 103 may be partially electrically decoupled from package substrate 304.

For example, a bond pad of universal chip 102 configured to deliver power to machine-learning block 103 may not be electrically coupled to package substrate 304. In another example, a bond pad of universal chip 102 configured to relay a voltage level of machine-learning block 103 to a power management chip may not be electrically coupled to package substrate 304, which may improve the integrity of other relayed voltage levels. In some examples, bumps 306 (illustrated in FIG. 3 in dashed lines) between machine-learning block 103 and package substrate 304 may be physically present, but package substrate 304 may lack bonding pads 308, routing layers, and/or power rails that connect to one or more of bumps 306 (e.g., as shown in FIG. 3). In additional examples, one or more bumps 306 may be completely omitted from a space directly between machine-learning block 103 and package substrate 304.

FIG. 4 is a diagram of another example packaging configuration 400 for example universal chip 102 in which less than all of the multiple functional blocks/ASICs of universal chip 102 are electrically coupled to package substrate 404 via conductive bonding elements (e.g., bumps 406) and bonding pads 408 on package substrate 404. A dielectric underfill material 410 may be positioned in a space between universal chip 102 and package substrate 404, and laterally between bumps 406 to mechanically secure universal chip 102 to package substrate 404 and to electrically isolate bumps 406 from each other.

As shown in this example, graphics block 101 and machine-learning block 103 may be electrically coupled to package substrate 404, while display block 105 may not be electrically coupled to package substrate 404. In some examples, display block 105 may be completely decoupled from package substrate 404 (e.g., no bumps 406 that electrically couple display block 105 to package substrate 404 may be provisioned (e.g., as shown in FIG. 4) and/or package substrate 404 may not include bonding pads 408, routing layers, or power rails to which display block 105 could be electrically coupled even with suitable bumps 406). Alternatively, display block 105 may be partially decoupled from package substrate 404.

For example, a bond pad of universal chip 102 configured to deliver power to display block 105 may not be electrically coupled to package substrate 404. In another example, a bond pad of universal chip 102 configured to relay a voltage level of display block 105 to a power management chip may not be electrically coupled to package substrate 404, which may improve the integrity of other relayed voltage levels. In some examples, bumps 406 between display block 105 and package substrate 404 may be physically present, but package substrate 404 may lack bonding pads 408, routing layers, and/or power rails that connect to one or more of bumps 406. In additional examples, one or more bumps 406 may be completely omitted from a space directly between display block 105 and package substrate 404 (e.g., as illustrated in FIG. 4).

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (such as, e.g., augmented-reality system 500 in FIG. 5) or that visually immerses a user in an artificial reality (such as, e.g., virtual-reality system 600 in FIG. 6). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 5:
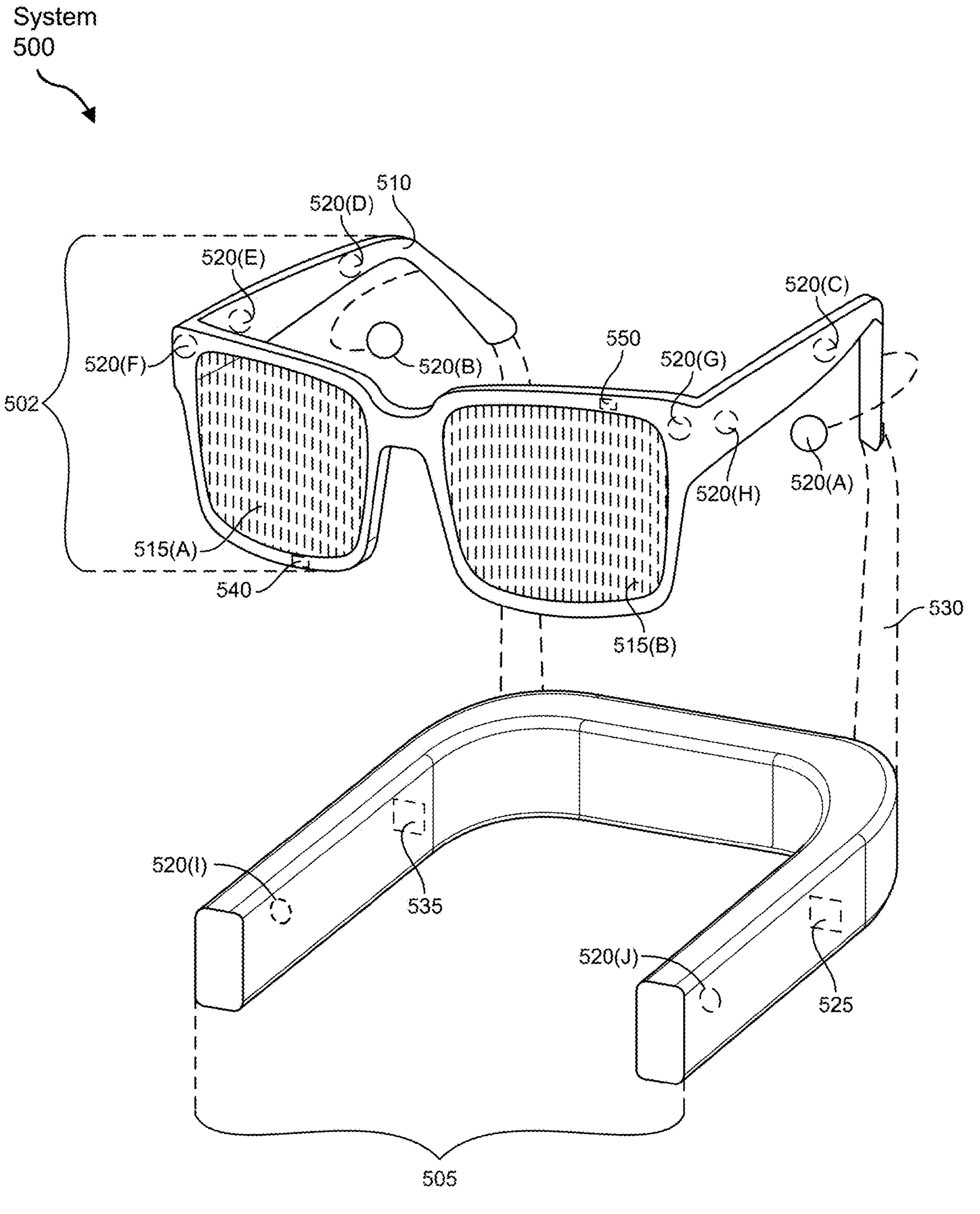
FIG. 5 is an illustration of example augmented-reality glasses that may be used in connection with at least one embodiment of this disclosure.

Turning to FIG. 5, augmented-reality system 500 may include an eyewear device 502 with a frame 510 configured to hold a left display device 515(A) and a right display device 515(B) in front of a user's eyes. Display devices 515(A) and 515(B) may act together or independently to present an image or series of images to a user. While augmented-reality system 500 includes two displays, embodiments of this disclosure may be implemented in augmented-reality systems with a single NED or more than two NEDs.

In some embodiments, augmented-reality system 500 may include one or more sensors, such as sensor 540. Sensor 540 may generate measurement signals in response to motion of augmented-reality system 500 and may be located on substantially any portion of frame 510. Sensor 540 may represent one or more of a variety of different sensing mechanisms, such as a position sensor, an inertial measurement unit (IMU), a depth camera assembly, a structured light emitter and/or detector, or any combination thereof. In some embodiments, augmented-reality system 500 may or may not include sensor 540 or may include more than one sensor. In embodiments in which sensor 540 includes an IMU, the IMU may generate calibration data based on measurement signals from sensor 540. Examples of sensor 540 may include, without limitation, accelerometers, gyroscopes, magnetometers, other suitable types of sensors that detect motion, sensors used for error correction of the IMU, or some combination thereof.

In some examples, augmented-reality system 500 may also include a microphone array with a plurality of acoustic transducers 520(A)-520(J), referred to collectively as acoustic transducers 520. Acoustic transducers 520 may represent transducers that detect air pressure variations induced by sound waves. Each acoustic transducer 520 may be configured to detect sound and convert the detected sound into an electronic format (e.g., an analog or digital format). The microphone array in FIG. 5 may include, for example, ten acoustic transducers: 520(A) and 520(B), which may be designed to be placed inside a corresponding ear of the user, acoustic transducers 520(C), 520(D), 520(E), 520(F), 520(G), and 520(H), which may be positioned at various locations on frame 510, and/or acoustic transducers 520(I) and 520(J), which may be positioned on a corresponding neckband 505.

In some embodiments, one or more of acoustic transducers 520(A)-(J) may be used as output transducers (e.g., speakers). For example, acoustic transducers 520(A) and/or 520(B) may be earbuds or any other suitable type of headphone or speaker.

The configuration of acoustic transducers 520 of the microphone array may vary. While augmented-reality system 500 is shown in FIG. 5 as having ten acoustic transducers 520, the number of acoustic transducers 520 may be greater or less than ten. In some embodiments, using higher numbers of acoustic transducers 520 may increase the amount of audio information collected and/or the sensitivity and accuracy of the audio information. In contrast, using a lower number of acoustic transducers 520 may decrease the computing power required by an associated controller 550 to process the collected audio information. In addition, the position of each acoustic transducer 520 of the microphone array may vary. For example, the position of an acoustic transducer 520 may include a defined position on the user, a defined coordinate on frame 510, an orientation associated with each acoustic transducer 520, or some combination thereof.

Acoustic transducers 520(A) and 520(B) may be positioned on different parts of the user's ear, such as behind the pinna, behind the tragus, and/or within the auricle or fossa. Or, there may be additional acoustic transducers 520 on or surrounding the ear in addition to acoustic transducers 520 inside the ear canal. Having an acoustic transducer 520 positioned next to an ear canal of a user may enable the microphone array to collect information on how sounds arrive at the ear canal. By positioning at least two of the acoustic transducers 520 on either side of a user's head (e.g., as binaural microphones), augmented-reality device 500 may simulate binaural hearing and capture a 3D stereo sound field around a user's head. In some embodiments, acoustic transducers 520(A) and 520(B) may be connected to augmented-reality system 500 via a wired connection 530, and in other embodiments acoustic transducers 520(A) and 520(B) may be connected to augmented-reality system 500 via a wireless connection (e.g., a BLUETOOTH connection). In still other embodiments, acoustic transducers 520(A) and 520(B) may not be used at all in conjunction with augmented-reality system 500.

Acoustic transducers 520 on frame 510 may be positioned in a variety of different ways, including along the length of the temples, across the bridge, above or below display devices 515(A) and 515(B), or some combination thereof. Acoustic transducers 520 may also be oriented such that the microphone array is able to detect sounds in a wide range of directions surrounding the user wearing the augmented-reality system 500. In some embodiments, an optimization process may be performed during manufacturing of augmented-reality system 500 to determine relative positioning of each acoustic transducer 520 in the microphone array.

In some examples, augmented-reality system 500 may include or be connected to an external device (e.g., a paired device), such as neckband 505. Neckband 505 generally represents any type or form of paired device. Thus, the following discussion of neckband 505 may also apply to various other paired devices, such as charging cases, smart watches, smart phones, wrist bands, other wearable devices, hand-held controllers, tablet computers, laptop computers, other external compute devices, etc.

As shown, neckband 505 may be coupled to eyewear device 502 via one or more connectors. The connectors may be wired or wireless and may include electrical and/or non-electrical (e.g., structural) components. In some cases, eyewear device 502 and neckband 505 may operate independently without any wired or wireless connection between them. While FIG. 5 illustrates the components of eyewear device 502 and neckband 505 in example locations on eyewear device 502 and neckband 505, the components may be located elsewhere and/or distributed differently on eyewear device 502 and/or neckband 505. In some embodiments, the components of eyewear device 502 and neckband 505 may be located on one or more additional peripheral devices paired with eyewear device 502, neckband 505, or some combination thereof.

Pairing external devices, such as neckband 505, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 500 may be provided by a paired device or shared between a paired device and an eyewear device, thus reducing the weight, heat profile, and form factor of the eyewear device overall while still retaining desired functionality. For example, neckband 505 may allow components that would otherwise be included on an eyewear device to be included in neckband 505 since users may tolerate a heavier weight load on their shoulders than they would tolerate on their heads. Neckband 505 may also have a larger surface area over which to diffuse and disperse heat to the ambient environment. Thus, neckband 505 may allow for greater battery and computation capacity than might otherwise have been possible on a stand-alone eyewear device. Since weight carried in neckband 505 may be less invasive to a user than weight carried in eyewear device 502, a user may tolerate wearing a lighter eyewear device and carrying or wearing the paired device for greater lengths of time than a user would tolerate wearing a heavy standalone eyewear device, thereby enabling users to more fully incorporate artificial-reality environments into their day-to-day activities.

Neckband 505 may be communicatively coupled with eyewear device 502 and/or to other devices. These other devices may provide certain functions (e.g., tracking, localizing, depth mapping, processing, storage, etc.) to augmented-reality system 500. In the embodiment of FIG. 5, neckband 505 may include two acoustic transducers (e.g., 520(I) and 520(J)) that are part of the microphone array (or potentially form their own microphone subarray). Neckband 505 may also include a controller 525 and a power source 535.

Acoustic transducers 520(I) and 520(J) of neckband 505 may be configured to detect sound and convert the detected sound into an electronic format (analog or digital). In the embodiment of FIG. 5, acoustic transducers 520(I) and 520(J) may be positioned on neckband 505, thereby increasing the distance between the neckband acoustic transducers 520(I) and 520(J) and other acoustic transducers 520 positioned on eyewear device 502. In some cases, increasing the distance between acoustic transducers 520 of the microphone array may improve the accuracy of beamforming performed via the microphone array. For example, if a sound is detected by acoustic transducers 520(C) and 520(D) and the distance between acoustic transducers 520(C) and 520(D) is greater than, e.g., the distance between acoustic transducers 520(D) and 520(E), the determined source location of the detected sound may be more accurate than if the sound had been detected by acoustic transducers 520(D) and 520(E).

Controller 525 of neckband 505 may process information generated by the sensors on neckband 505 and/or augmented-reality system 500. For example, controller 525 may process information from the microphone array that describes sounds detected by the microphone array. For each detected sound, controller 525 may perform a direction-of-arrival (DOA) estimation to estimate a direction from which the detected sound arrived at the microphone array. As the microphone array detects sounds, controller 525 may populate an audio data set with the information. In embodiments in which augmented-reality system 500 includes an inertial measurement unit, controller 525 may compute all inertial and spatial calculations from the IMU located on eyewear device 502. A connector may convey information between augmented-reality system 500 and neckband 505 and between augmented-reality system 500 and controller 525. The information may be in the form of optical data, electrical data, wireless data, or any other transmittable data form. Moving the processing of information generated by augmented-reality system 500 to neckband 505 may reduce weight and heat in eyewear device 502, making it more comfortable to the user.

Power source 535 in neckband 505 may provide power to eyewear device 502 and/or to neckband 505. Power source 535 may include, without limitation, lithium ion batteries, lithium-polymer batteries, primary lithium batteries, alkaline batteries, or any other form of power storage. In some cases, power source 535 may be a wired power source. Including power source 535 on neckband 505 instead of on eyewear device 502 may help better distribute the weight and heat generated by power source 535.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 600 in FIG. 6, that mostly or completely covers a user's field of view. Virtual-reality system 600 may include a front rigid body 602 and a band 604 shaped to fit around a user's head. Virtual-reality system 600 may also include output audio transducers 606(A) and 606(B). Furthermore, while not shown in FIG. 6, front rigid body 602 may include one or more electronic elements, including one or more electronic displays, one or more inertial measurement units (IMUs), one or more tracking emitters or detectors, and/or any other suitable device or system for creating an artificial-reality experience.

Artificial-reality systems may include a variety of types of visual feedback mechanisms. For example, display devices in augmented-reality system 500 and/or virtual-reality system 600 may include one or more liquid crystal displays (LCDs), light emitting diode (LED) displays, microLED displays, organic LED (OLED) displays, digital light projector (DLP) micro-displays, liquid crystal on silicon (LCoS) micro-displays, and/or any other suitable type of display screen. These artificial-reality systems may include a single display screen for both eyes or may provide a display screen for each eye, which may allow for additional flexibility for varifocal adjustments or for correcting a user's refractive error. Some of these artificial-reality systems may also include optical subsystems having one or more lenses (e.g., concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some of the artificial-reality systems described herein may include one or more projection systems. For example, display devices in augmented-reality system 500 and/or virtual-reality system 600 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

The artificial-reality systems described herein may also include various types of computer vision components and subsystems. For example, augmented-reality system 500 and/or virtual-reality system 600 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

The artificial-reality systems described herein may also include one or more input and/or output audio transducers. Output audio transducers may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

In some embodiments, the artificial-reality systems described herein may also include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

Some augmented-reality systems may map a user's and/or device's environment using techniques referred to as "simultaneous location and mapping" (SLAM). SLAM mapping and location identifying techniques may involve a variety of hardware and software tools that can create or update a map of an environment while simultaneously keeping track of a user's location within the mapped environment. SLAM may use many different types of sensors to create a map and determine a user's position within the map.

SLAM techniques may, for example, implement optical sensors to determine a user's location. Radios including WiFi, BLUETOOTH, global positioning system (GPS), cellular or other communication devices may be also used to determine a user's location relative to a radio transceiver or group of transceivers (e.g., a WiFi router or group of GPS satellites). Acoustic sensors such as microphone arrays or 2D or 3D sonar sensors may also be used to determine a user's location within an environment. Augmented-reality and virtual-reality devices (such as systems 500 and 600 of FIGS. 5 and 6, respectively) may incorporate any or all of these types of sensors to perform SLAM operations such as creating and continually updating maps of the user's current environment. In at least some of the embodiments described herein, SLAM data generated by these sensors may be referred to as "environmental data" and may indicate a user's current environment. This data may be stored in a local or remote data store (e.g., a cloud data store) and may be provided to a user's AR/VR device on demand.

When the user is wearing an augmented-reality headset or virtual-reality headset in a given environment, the user may be interacting with other users or other electronic devices that serve as audio sources. In some cases, it may be desirable to determine where the audio sources are located relative to the user and then present the audio sources to the user as if they were coming from the location of the audio source. The process of determining where the audio sources are located relative to the user may be referred to as "localization," and the process of rendering playback of the audio source signal to appear as if it is coming from a specific direction may be referred to as "spatialization."

Localizing an audio source may be performed in a variety of different ways. In some cases, an augmented-reality or virtual-reality headset may initiate a DOA analysis to determine the location of a sound source. The DOA analysis may include analyzing the intensity, spectra, and/or arrival time of each sound at the artificial-reality device to determine the direction from which the sounds originated. The DOA analysis may include any suitable algorithm for analyzing the surrounding acoustic environment in which the artificial-reality device is located.

For example, the DOA analysis may be designed to receive input signals from a microphone and apply digital signal processing algorithms to the input signals to estimate the direction of arrival. These algorithms may include, for example, delay and sum algorithms where the input signal is sampled, and the resulting weighted and delayed versions of the sampled signal are averaged together to determine a direction of arrival. A least mean squared (LMS) algorithm may also be implemented to create an adaptive filter. This adaptive filter may then be used to identify differences in signal intensity, for example, or differences in time of arrival. These differences may then be used to estimate the direction of arrival. In another embodiment, the DOA may be determined by converting the input signals into the frequency domain and selecting specific bins within the time-frequency (TF) domain to process. Each selected TF bin may be processed to determine whether that bin includes a portion of the audio spectrum with a direct-path audio signal. Those bins having a portion of the direct-path signal may then be analyzed to identify the angle at which a microphone array received the direct-path audio signal. The determined angle may then be used to identify the direction of arrival for the received input signal. Other algorithms not listed above may also be used alone or in combination with the above algorithms to determine DOA.

In some embodiments, different users may perceive the source of a sound as coming from slightly different locations. This may be the result of each user having a unique head-related transfer function (HRTF), which may be dictated by a user's anatomy including ear canal length and the positioning of the ear drum. The artificial-reality device may provide an alignment and orientation guide, which the user may follow to customize the sound signal presented to the user based on their unique HRTF. In some embodiments, an artificial-reality device may implement one or more microphones to listen to sounds within the user's environment. The augmented-reality or virtual-reality headset may use a variety of different array transfer functions (e.g., any of the DOA algorithms identified above) to estimate the direction of arrival for the sounds. Once the direction of arrival has been determined, the artificial-reality device may play back sounds to the user according to the user's unique HRTF. Accordingly, the DOA estimation generated using the array transfer function (ATF) may be used to determine the direction from which the sounds are to be played from. The playback sounds may be further refined based on how that specific user hears sounds according to the HRTF.

In addition to or as an alternative to performing a DOA estimation, an artificial-reality device may perform localization based on information received from other types of sensors. These sensors may include cameras, IR sensors, heat sensors, motion sensors, GPS receivers, or in some cases, sensors that detect a user's eye movements. For example, as noted above, an artificial-reality device may include an eye tracker or gaze detector that determines where the user is looking. Often, the user's eyes will look at the source of the sound, if only briefly. Such clues provided by the user's eyes may further aid in determining the location of a sound source. Other sensors such as cameras, heat sensors, and IR sensors may also indicate the location of a user, the location of an electronic device, or the location of another sound source. Any or all of the above methods may be used individually or in combination to determine the location of a sound source and may further be used to update the location of a sound source over time.

Some embodiments may implement the determined DOA to generate a more customized output audio signal for the user. For instance, an "acoustic transfer function" may characterize or define how a sound is received from a given location. More specifically, an acoustic transfer function may define the relationship between parameters of a sound at its source location and the parameters by which the sound signal is detected (e.g., detected by a microphone array or detected by a user's ear). An artificial-reality device may include one or more acoustic sensors that detect sounds within range of the device. A controller of the artificial-reality device may estimate a DOA for the detected sounds (using, e.g., any of the methods identified above) and, based on the parameters of the detected sounds, may generate an acoustic transfer function that is specific to the location of the device. This customized acoustic transfer function may thus be used to generate a spatialized output audio signal where the sound is perceived as coming from a specific location.

Indeed, once the location of the sound source or sources is known, the artificial-reality device may re-render (i.e., spatialize) the sound signals to sound as if coming from the direction of that sound source. The artificial-reality device may apply filters or other digital signal processing that alter the intensity, spectra, or arrival time of the sound signal. The digital signal processing may be applied in such a way that the sound signal is perceived as originating from the determined location. The artificial-reality device may amplify or subdue certain frequencies or change the time that the signal arrives at each ear. In some cases, the artificial-reality device may create an acoustic transfer function that is specific to the location of the device and the detected direction of arrival of the sound signal. In some embodiments, the artificial-reality device may re-render the source signal in a stereo device or multi-speaker device (e.g., a surround sound device). In such cases, separate and distinct audio signals may be sent to each speaker. Each of these audio signals may be altered according to the user's HRTF and according to measurements of the user's location and the location of the sound source to sound as if they are coming from the determined location of the sound source. Accordingly, in this manner, the artificial-reality device (or speakers associated with the device) may re-render an audio signal to sound as if originating from a specific location.

As noted, artificial-reality systems 500 and 600 may be used with a variety of other types of devices to provide a more compelling artificial-reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 7:
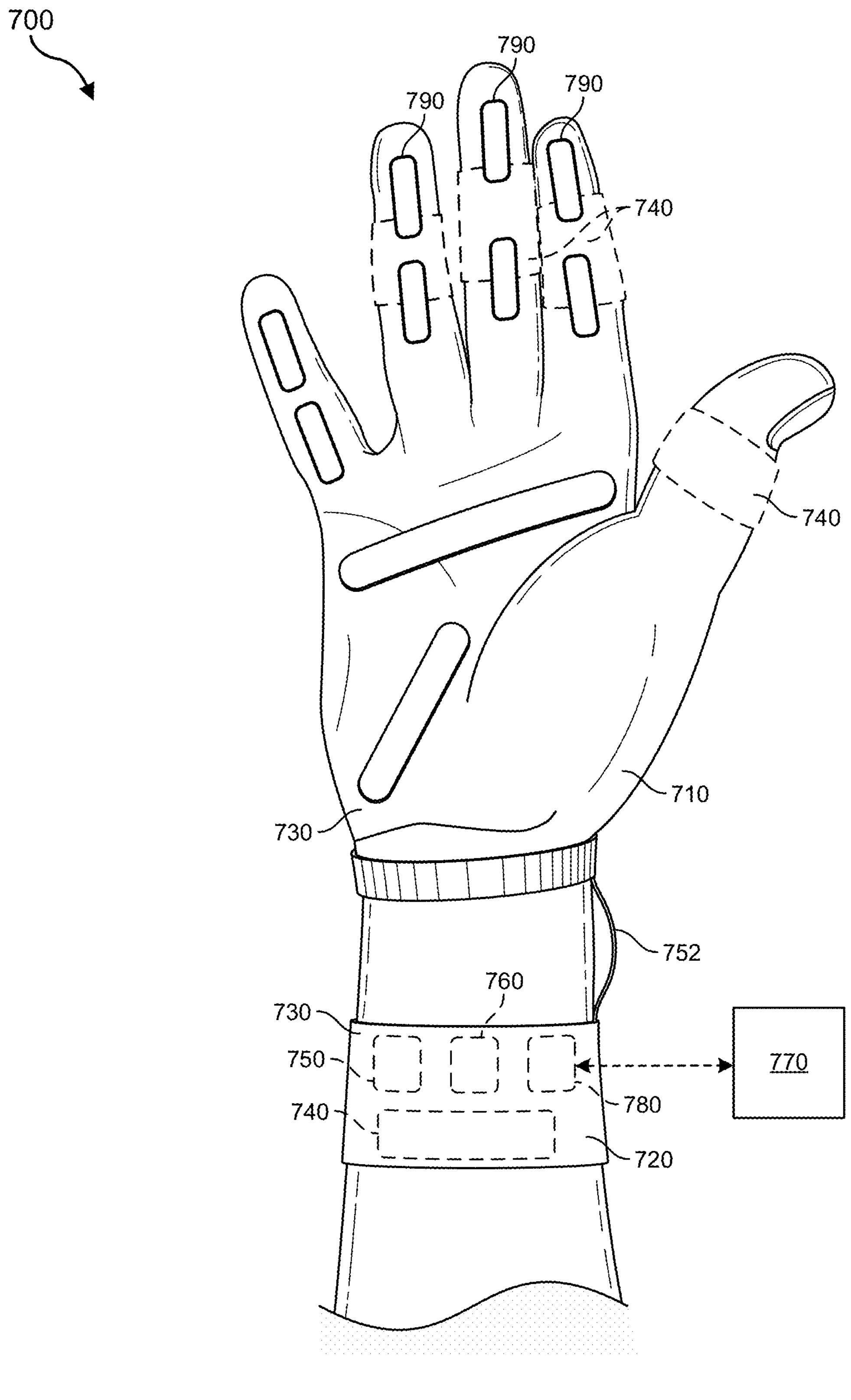
FIG. 7 is an illustration of example haptic devices that may be used in connection with at least one embodiment of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 7 illustrates a vibrotactile system 700 in the form of a wearable glove (haptic device 710) and wristband (haptic device 720). Haptic device 710 and haptic device 720 are shown as examples of wearable devices that include a flexible, wearable textile material 730 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 740 may be positioned at least partially within one or more corresponding pockets formed in textile material 730 of vibrotactile system 700. Vibrotactile devices 740 may be positioned in locations to provide a vibrating sensation (e.g., haptic feedback) to a user of vibrotactile system 700. For example, vibrotactile devices 740 may be positioned against the user's finger(s), thumb, or wrist, as shown in FIG. 7. Vibrotactile devices 740 may, in some examples, be sufficiently flexible to conform to or bend with the user's corresponding body part(s).

A power source 750 (e.g., a battery) for applying a voltage to the vibrotactile devices 740 for activation thereof may be electrically coupled to vibrotactile devices 740, such as via conductive wiring 752. In some examples, each of vibrotactile devices 740 may be independently electrically coupled to power source 750 for individual activation. In some embodiments, a processor 760 may be operatively coupled to power source 750 and configured (e.g., programmed) to control activation of vibrotactile devices 740.

Vibrotactile system 700 may be implemented in a variety of ways. In some examples, vibrotactile system 700 may be a standalone system with integral subsystems and components for operation independent of other devices and systems. As another example, vibrotactile system 700 may be configured for interaction with another device or system 770. For example, vibrotactile system 700 may, in some examples, include a communications interface 780 for receiving and/or sending signals to the other device or system 770. The other device or system 770 may be a mobile device, a gaming console, an artificial-reality (e.g., virtual-reality, augmented-reality, mixed-reality) device, a personal computer, a tablet computer, a network device (e.g., a modem, a router, etc.), a handheld controller, etc. Communications interface 780 may enable communications between vibrotactile system 700 and the other device or system 770 via a wireless (e.g., Wi-Fi, BLUETOOTH, cellular, radio, etc.) link or a wired link. If present, communications interface 780 may be in communication with processor 760, such as to provide a signal to processor 760 to activate or deactivate one or more of the vibrotactile devices 740.

Vibrotactile system 700 may optionally include other subsystems and components, such as touch-sensitive pads 790, pressure sensors, motion sensors, position sensors, lighting elements, and/or user interface elements (e.g., an on/off button, a vibration control element, etc.). During use, vibrotactile devices 740 may be configured to be activated for a variety of different reasons, such as in response to the user's interaction with user interface elements, a signal from the motion or position sensors, a signal from the touch-sensitive pads 790, a signal from the pressure sensors, a signal from the other device or system 770, etc.

Although power source 750, processor 760, and communications interface 780 are illustrated in FIG. 7 as being positioned in haptic device 720, the present disclosure is not so limited. For example, one or more of power source 750, processor 760, or communications interface 780 may be positioned within haptic device 710 or within another wearable textile.

Figure 8:
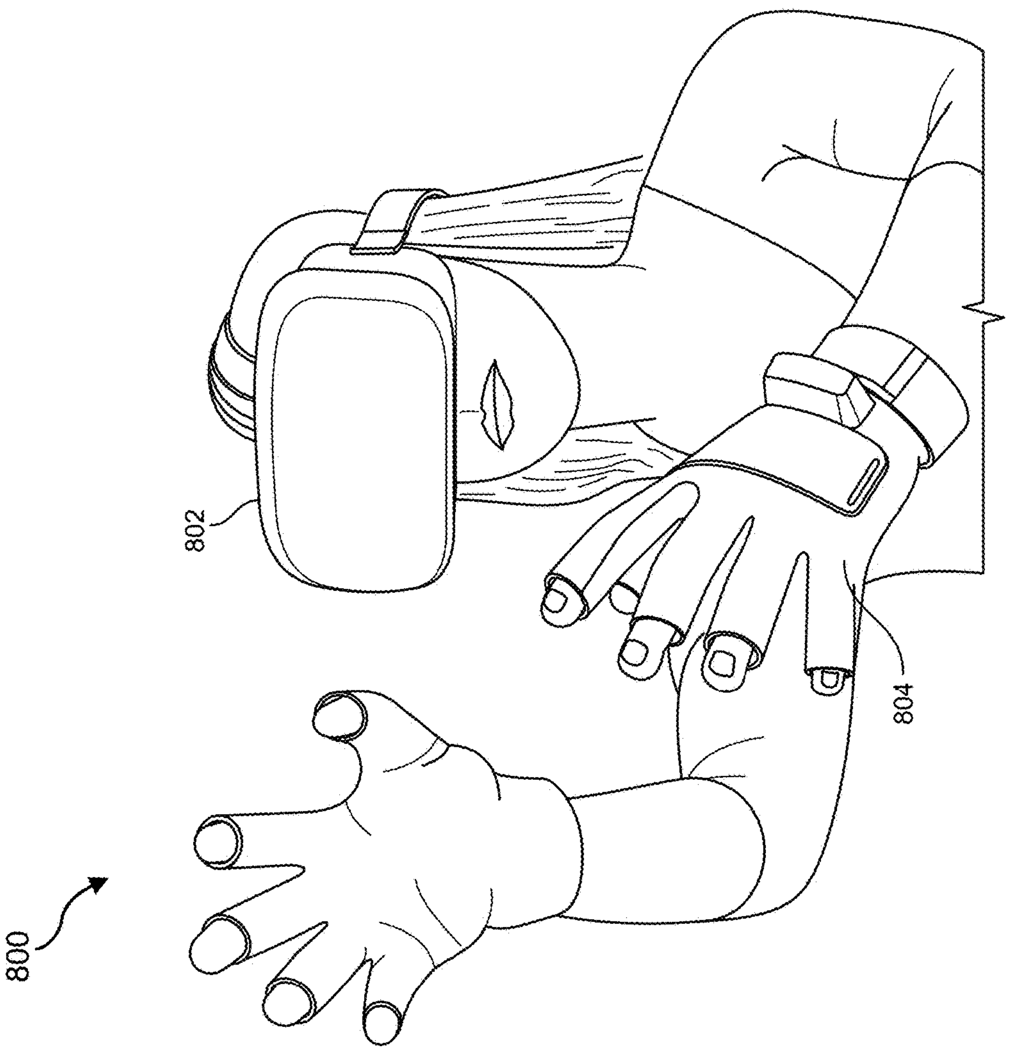
FIG. 8 is an illustration of an example virtual-reality environment, according to at least one embodiment of this disclosure.

Haptic wearables, such as those shown in and described in connection with FIG. 7, may be implemented in a variety of types of artificial-reality systems and environments. FIG. 8 shows an example artificial-reality environment 800 including one head-mounted virtual-reality display and two haptic devices (i.e., gloves), and in other embodiments any number and/or combination of these components and other components may be included in an artificial-reality system. For example, in some embodiments there may be multiple head-mounted displays each having an associated haptic device, with each head-mounted display and each haptic device communicating with the same console, portable computing device, or other computing system.

Figure 6:
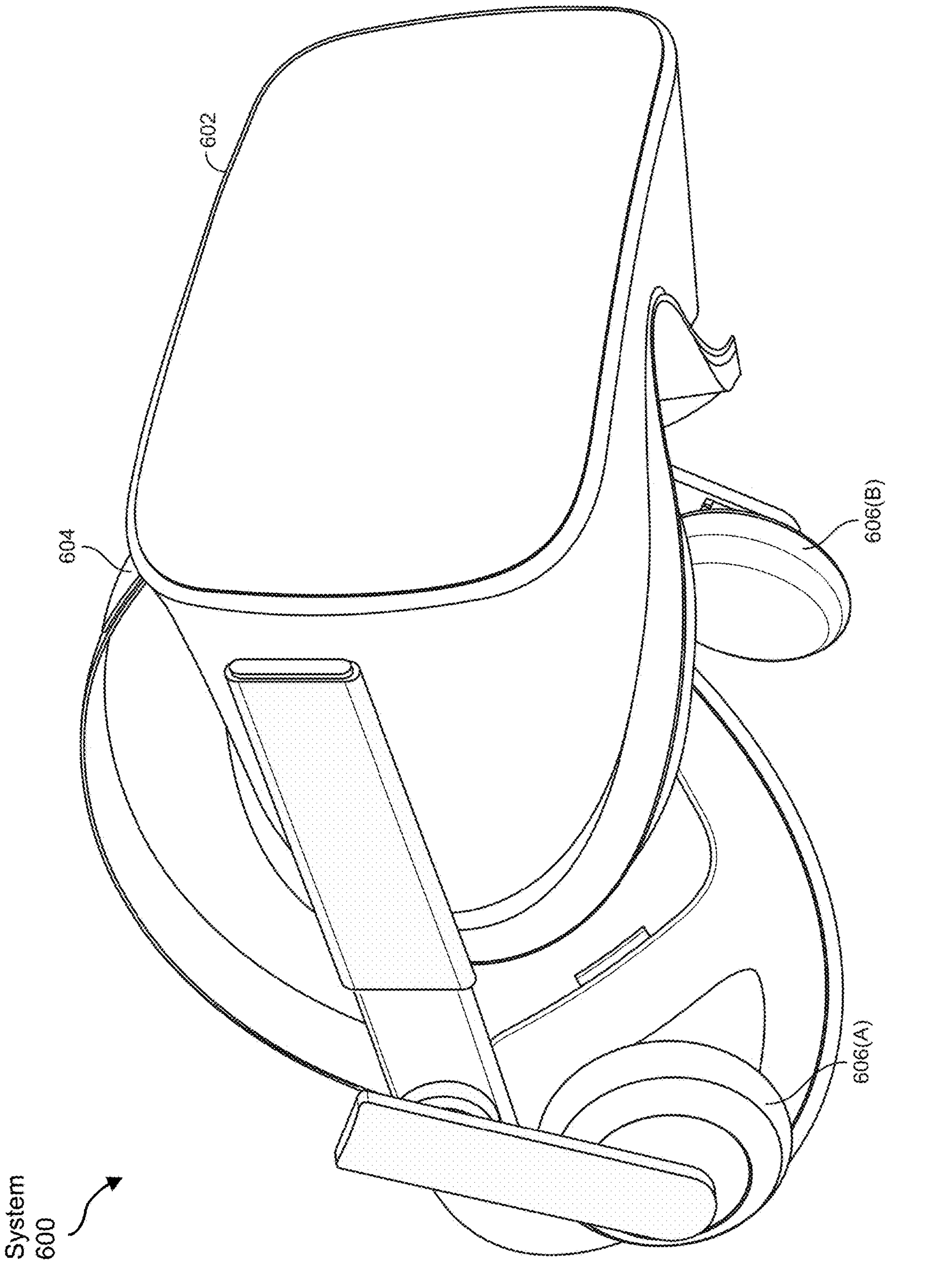
FIG. 6 is an illustration of an example virtual-reality headset that may be used in connection with at least one embodiment of this disclosure.

Head-mounted display 802 generally represents any type or form of virtual-reality system, such as virtual-reality system 600 in FIG. 6. Haptic device 804 generally represents any type or form of wearable device, worn by a user of an artificial-reality system, that provides haptic feedback to the user to give the user the perception that he or she is physically engaging with a virtual object. In some embodiments, haptic device 804 may provide haptic feedback by applying vibration, motion, and/or force to the user. For example, haptic device 804 may limit or augment a user's movement. To give a specific example, haptic device 804 may limit a user's hand from moving forward so that the user has the perception that his or her hand has come in physical contact with a virtual wall. In this specific example, one or more actuators within the haptic device may achieve the physical-movement restriction by pumping fluid into an inflatable bladder of the haptic device. In some examples, a user may also use haptic device 804 to send action requests to a console. Examples of action requests include, without limitation, requests to start an application and/or end the application and/or requests to perform a particular action within the application.

Figure 9:
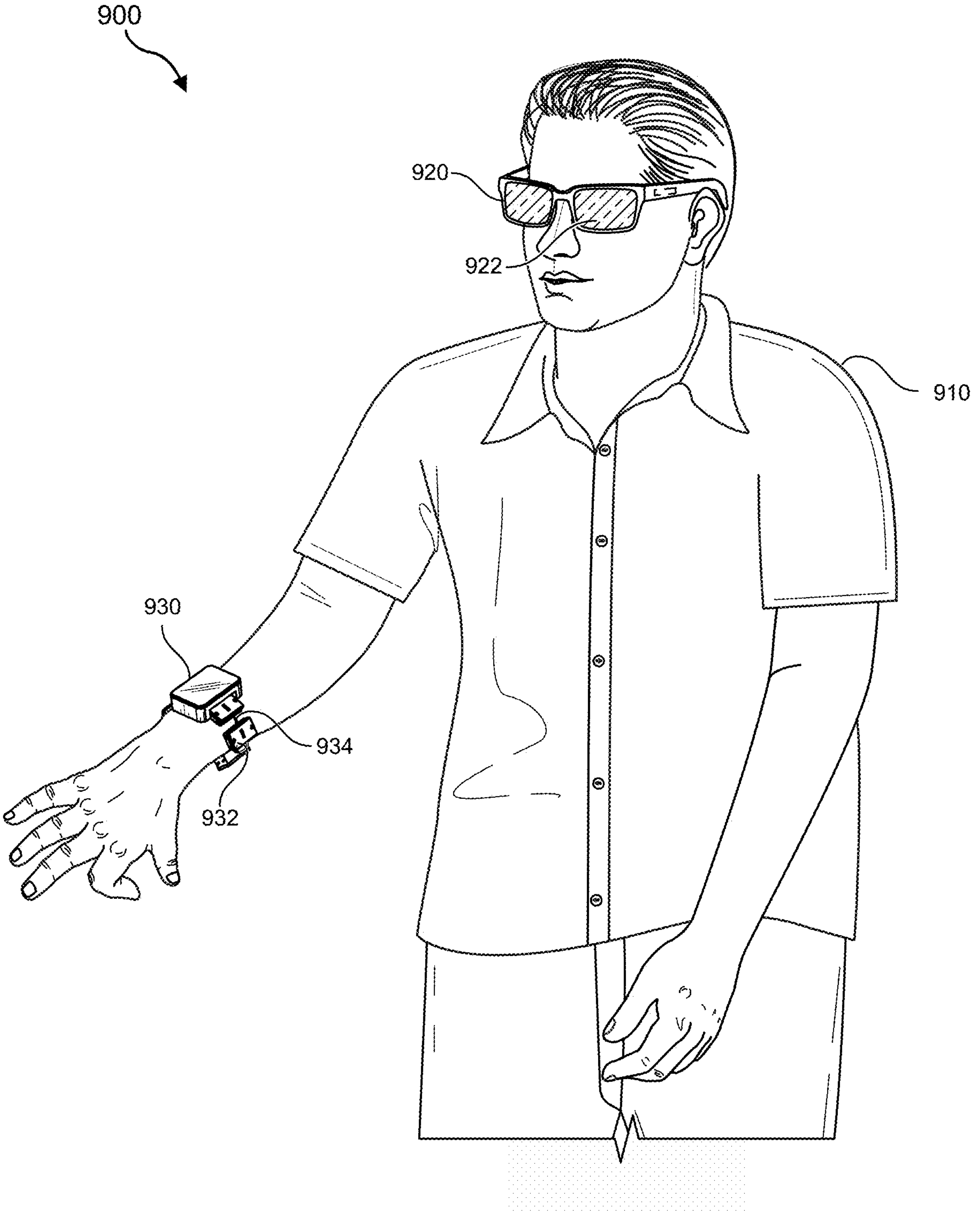
FIG. 9 is an illustration of an example augmented-reality environment, according to at least one embodiment of this disclosure.

While haptic interfaces may be used with virtual-reality systems, as shown in FIG. 8, haptic interfaces may also be used with augmented-reality systems, as shown in FIG. 9. FIG. 9 is a perspective view of a user 910 interacting with an augmented-reality system 900. In this example, user 910 may wear a pair of augmented-reality glasses 920 that may have one or more displays 922 and that are paired with a haptic device 930. In this example, haptic device 930 may be a wristband that includes a plurality of band elements 932 and a tensioning mechanism 934 that connects band elements 932 to one another.

One or more of band elements 932 may include any type or form of actuator suitable for providing haptic feedback. For example, one or more of band elements 932 may be configured to provide one or more of various types of cutaneous feedback, including vibration, force, traction, texture, and/or temperature. To provide such feedback, band elements 932 may include one or more of various types of actuators. In one example, each of band elements 932 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 710, 720, 804, and 930 may include any suitable number and/or type of haptic transducer, sensor, and/or feedback mechanism. For example, haptic devices 710, 720, 804, and 930 may include one or more mechanical transducers, piezoelectric transducers, and/or fluidic transducers. Haptic devices 710, 720, 804, and 930 may also include various combinations of different types and forms of transducers that work together or independently to enhance a user's artificial-reality experience. In one example, each of band elements 932 of haptic device 930 may include a vibrotactor (e.g., a vibrotactile actuator) configured to vibrate in unison or independently to provide one or more of various types of haptic sensations to a user.

In some embodiments, the systems described herein may also include an eye-tracking subsystem designed to identify and track various characteristics of a user's eye(s), such as the user's gaze direction. The phrase "eye tracking" may, in some examples, refer to a process by which the position, orientation, and/or motion of an eye is measured, detected, sensed, determined, and/or monitored. The disclosed systems may measure the position, orientation, and/or motion of an eye in a variety of different ways, including through the use of various optical-based eye-tracking techniques, ultrasound-based eye-tracking techniques, etc. An eye-tracking subsystem may be configured in a number of different ways and may include a variety of different eye-tracking hardware components or other computer-vision components. For example, an eye-tracking subsystem may include a variety of different optical sensors, such as two-dimensional (2D) or 3D cameras, time-of-flight depth sensors, single-beam or sweeping laser rangefinders, 3D LiDAR sensors, and/or any other suitable type or form of optical sensor. In this example, a processing subsystem may process data from one or more of these sensors to measure, detect, determine, and/or otherwise monitor the position, orientation, and/or motion of the user's eye(s).

Figure 10:
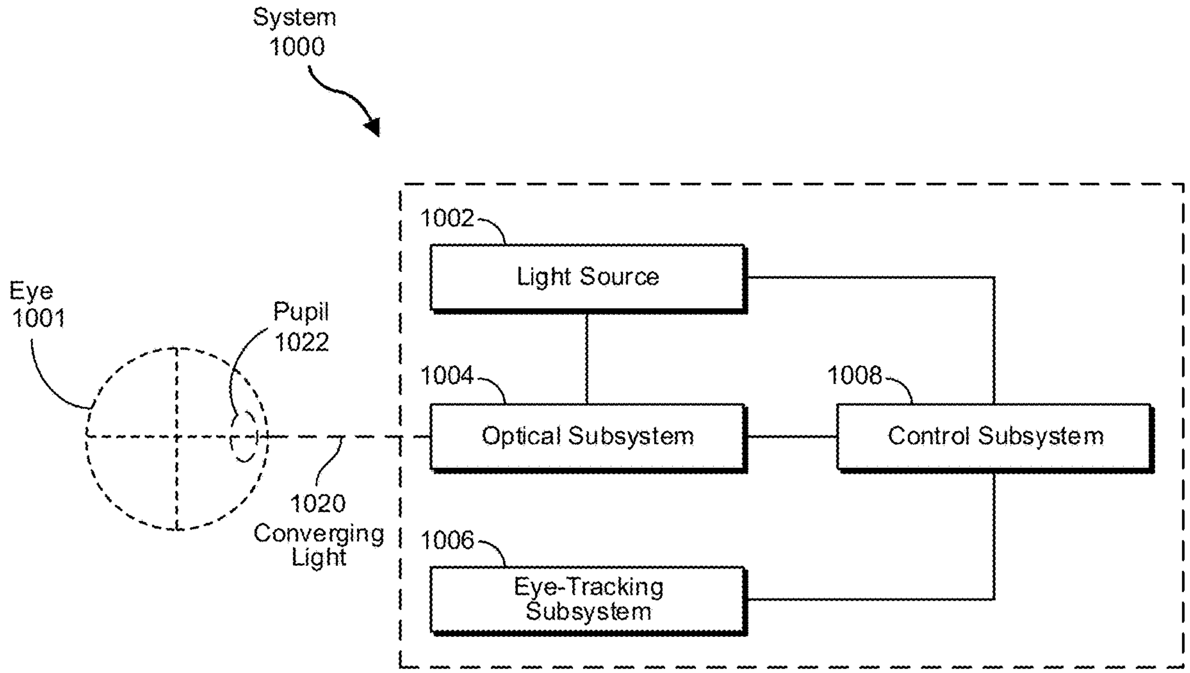
FIG. 10 is an illustration of an example system that incorporates an eye-tracking subsystem capable of tracking a user's eye(s).

FIG. 10 is an illustration of an example system 1000 that incorporates an eye-tracking subsystem capable of tracking a user's eye(s). As depicted in FIG. 10, system 1000 may include a light source 1002, an optical subsystem 1004, an eye-tracking subsystem 1006, and/or a control subsystem 1008. In some examples, light source 1002 may generate light for an image (e.g., to be presented to an eye 1001 of the viewer). Light source 1002 may represent any of a variety of suitable devices. For example, light source 1002 can include a two-dimensional projector (e.g., a LCoS display), a scanning source (e.g., a scanning laser), or other device (e.g., an LCD, an LED display, an OLED display, an active-matrix OLED display (AMOLED), a transparent OLED display (TOLED), a waveguide, or some other display capable of generating light for presenting an image to the viewer). In some examples, the image may represent a virtual image, which may refer to an optical image formed from the apparent divergence of light rays from a point in space, as opposed to an image formed from the light ray's actual divergence.

In some embodiments, optical subsystem 1004 may receive the light generated by light source 1002 and generate, based on the received light, converging light 1020 that includes the image. In some examples, optical subsystem 1004 may include any number of lenses (e.g., Fresnel lenses, convex lenses, concave lenses), apertures, filters, mirrors, prisms, and/or other optical components, possibly in combination with actuators and/or other devices. In particular, the actuators and/or other devices may translate and/or rotate one or more of the optical components to alter one or more aspects of converging light 1020. Further, various mechanical couplings may serve to maintain the relative spacing and/or the orientation of the optical components in any suitable combination.

In one embodiment, eye-tracking subsystem 1006 may generate tracking information indicating a gaze angle of an eye 1001 of the viewer. In this embodiment, control subsystem 1008 may control aspects of optical subsystem 1004 (e.g., the angle of incidence of converging light 1020) based at least in part on this tracking information. Additionally, in some examples, control subsystem 1008 may store and utilize historical tracking information (e.g., a history of the tracking information over a given duration, such as the previous second or fraction thereof) to anticipate the gaze angle of eye 1001 (e.g., an angle between the visual axis and the anatomical axis of eye 1001). In some embodiments, eye-tracking subsystem 1006 may detect radiation emanating from some portion of eye 1001 (e.g., the cornea, the iris, the pupil, or the like) to determine the current gaze angle of eye 1001. In other examples, eye-tracking subsystem 1006 may employ a wavefront sensor to track the current location of the pupil.

Any number of techniques can be used to track eye 1001. Some techniques may involve illuminating eye 1001 with infrared light and measuring reflections with at least one optical sensor that is tuned to be sensitive to the infrared light. Information about how the infrared light is reflected from eye 1001 may be analyzed to determine the position(s), orientation(s), and/or motion(s) of one or more eye feature (s), such as the cornea, pupil, iris, and/or retinal blood vessels.

In some examples, the radiation captured by a sensor of eye-tracking subsystem 1006 may be digitized (i.e., converted to an electronic signal). Further, the sensor may transmit a digital representation of this electronic signal to one or more processors (for example, processors associated with a device including eye-tracking subsystem 1006). Eye-tracking subsystem 1006 may include any of a variety of sensors in a variety of different configurations. For example, eye-tracking subsystem 1006 may include an infrared detector that reacts to infrared radiation. The infrared detector may be a thermal detector, a photonic detector, and/or any other suitable type of detector. Thermal detectors may include detectors that react to thermal effects of the incident infrared radiation.

In some examples, one or more processors may process the digital representation generated by the sensor(s) of eye-tracking subsystem 1006 to track the movement of eye 1001. In another example, these processors may track the movements of eye 1001 by executing algorithms represented by computer-executable instructions stored on non-transitory memory. In some examples, on-chip logic (e.g., an ASIC) may be used to perform at least portions of such algorithms. As noted, eye-tracking subsystem 1006 may be programmed to use an output of the sensor(s) to track movement of eye 1001. In some embodiments, eye-tracking subsystem 1006 may analyze the digital representation generated by the sensors to extract eye rotation information from changes in reflections. In one embodiment, eye-tracking subsystem 1006 may use corneal reflections or glints (also known as Purkinje images) and/or the center of the eye's pupil 1022 as features to track over time.

In some embodiments, eye-tracking subsystem 1006 may use the center of the eye's pupil 1022 and infrared or near-infrared, non-collimated light to create corneal reflections. In these embodiments, eye-tracking subsystem 1006 may use the vector between the center of the eye's pupil 1022 and the corneal reflections to compute the gaze direction of eye 1001. In some embodiments, the disclosed systems may perform a calibration procedure for an individual (using, e.g., supervised or unsupervised techniques) before tracking the user's eyes. For example, the calibration procedure may include directing users to look at one or more points displayed on a display while the eye-tracking system records the values that correspond to each gaze position associated with each point.

In some embodiments, eye-tracking subsystem 1006 may use two types of infrared and/or near-infrared (also known as active light) eye-tracking techniques: bright-pupil and dark-pupil eye tracking, which may be differentiated based on the location of an illumination source with respect to the optical elements used. If the illumination is coaxial with the optical path, then eye 1001 may act as a retroreflector as the light reflects off the retina, thereby creating a bright pupil effect similar to a red-eye effect in photography. If the illumination source is offset from the optical path, then the eye's pupil 1022 may appear dark because the retroreflection from the retina is directed away from the sensor. In some embodiments, bright-pupil tracking may create greater iris/pupil contrast, allowing more robust eye tracking with iris pigmentation, and may feature reduced interference (e.g., interference caused by eyelashes and other obscuring features). Bright-pupil tracking may also allow tracking in lighting conditions ranging from total darkness to a very bright environment.

In some embodiments, control subsystem 1008 may control light source 1002 and/or optical subsystem 1004 to reduce optical aberrations (e.g., chromatic aberrations and/or monochromatic aberrations) of the image that may be caused by or influenced by eye 1001. In some examples, as mentioned above, control subsystem 1008 may use the tracking information from eye-tracking subsystem 1006 to perform such control. For example, in controlling light source 1002, control subsystem 1008 may alter the light generated by light source 1002 (e.g., by way of image rendering) to modify (e.g., pre-distort) the image so that the aberration of the image caused by eye 1001 is reduced.

The disclosed systems may track both the position and relative size of the pupil (since, e.g., the pupil dilates and/or contracts). In some examples, the eye-tracking devices and components (e.g., sensors and/or sources) used for detecting and/or tracking the pupil may be different (or calibrated differently) for different types of eyes. For example, the frequency range of the sensors may be different (or separately calibrated) for eyes of different colors and/or different pupil types, sizes, and/or the like. As such, the various eye-tracking components (e.g., infrared sources and/or sensors) described herein may need to be calibrated for each individual user and/or eye.

The disclosed systems may track both eyes with and without ophthalmic correction, such as that provided by contact lenses worn by the user. In some embodiments, ophthalmic correction elements (e.g., adjustable lenses) may be directly incorporated into the artificial reality systems described herein. In some examples, the color of the user's eye may necessitate modification of a corresponding eye-tracking algorithm. For example, eye-tracking algorithms may need to be modified based at least in part on the differing color contrast between a brown eye and, for example, a blue eye.

Figure 11:
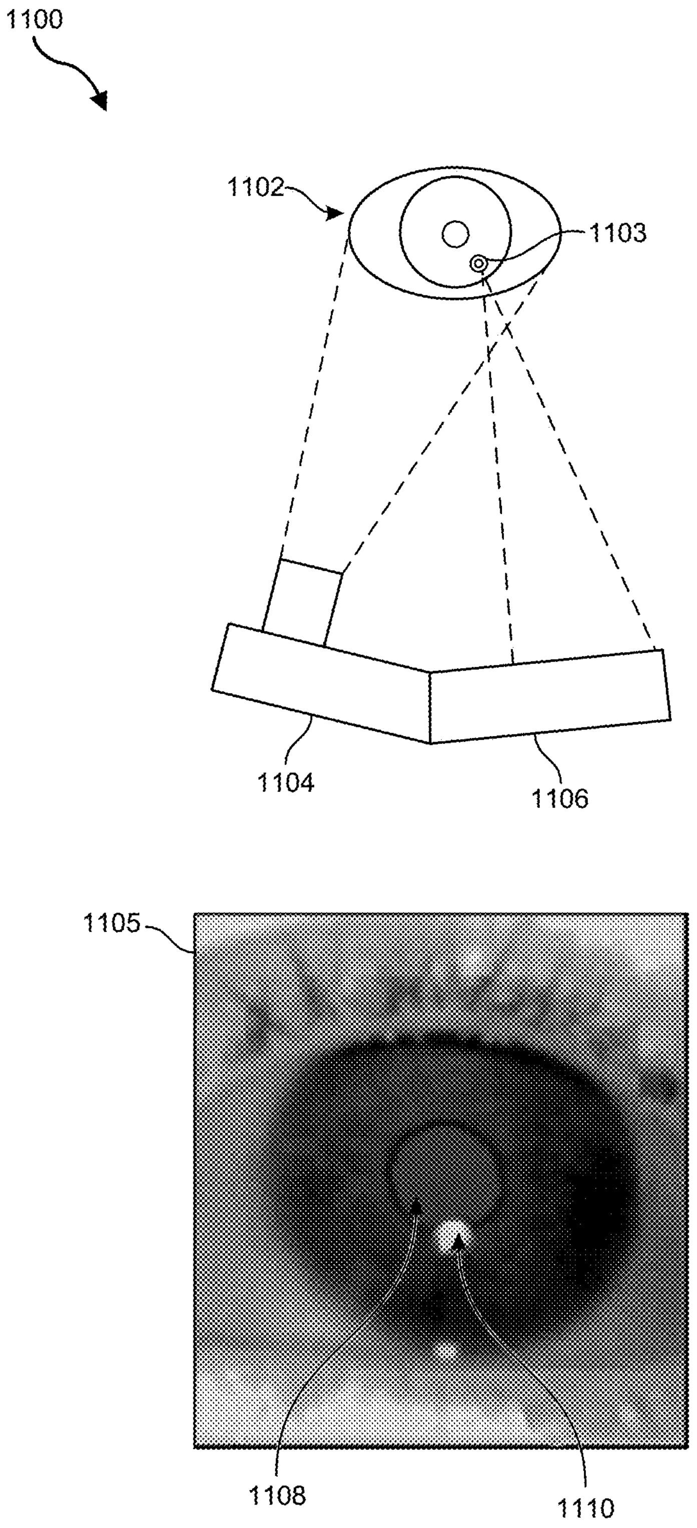
FIG. 11 is a more detailed illustration of various aspects of the eye-tracking subsystem illustrated in FIG. 10.

FIG. 11 is a more detailed illustration of various aspects of the eye-tracking subsystem illustrated in FIG. 10. As shown in this figure, an eye-tracking subsystem 1100 may include at least one source 1104 and at least one sensor 1106. Source 1104 generally represents any type or form of element capable of emitting radiation. In one example, source 1104 may generate visible, infrared, and/or near-infrared radiation. In some examples, source 1104 may radiate non-collimated infrared and/or near-infrared portions of the electromagnetic spectrum towards an eye 1102 of a user. Source 1104 may utilize a variety of sampling rates and speeds. For example, the disclosed systems may use sources with higher sampling rates in order to capture fixational eye movements of a user's eye 1102 and/or to correctly measure saccade dynamics of the user's eye 1102. As noted above, any type or form of eye-tracking technique may be used to track the user's eye 1102, including optical-based eye-tracking techniques, ultrasound-based eye-tracking techniques, etc.

Sensor 1106 generally represents any type or form of element capable of detecting radiation, such as radiation reflected off the user's eye 1102. Examples of sensor 1106 include, without limitation, a charge coupled device (CCD), a photodiode array, a complementary metal-oxide-semiconductor (CMOS) based sensor device, and/or the like. In one example, sensor 1106 may represent a sensor having predetermined parameters, including, but not limited to, a dynamic resolution range, linearity, and/or other characteristic selected and/or designed specifically for eye tracking.

As detailed above, eye-tracking subsystem 1100 may generate one or more glints. As detailed above, a glint 1103 may represent reflections of radiation (e.g., infrared radiation from an infrared source, such as source 1104) from the structure of the user's eye. In various embodiments, glint 1103 and/or the user's pupil may be tracked using an eye-tracking algorithm executed by a processor (either within or external to an artificial reality device). For example, an artificial reality device may include a processor and/or a memory device in order to perform eye tracking locally and/or a transceiver to send and receive the data necessary to perform eye tracking on an external device (e.g., a mobile phone, cloud server, or other computing device).

FIG. 11 shows an example image 1105 captured by an eye-tracking subsystem, such as eye-tracking subsystem 1100. In this example, image 1105 may include both the user's pupil 1108 and a glint 1110 near the same. In some examples, pupil 1108 and/or glint 1110 may be identified using an artificial-intelligence-based algorithm, such as a computer-vision-based algorithm. In one embodiment, image 1105 may represent a single frame in a series of frames that may be analyzed continuously in order to track the eye 1102 of the user. Further, pupil 1108 and/or glint 1110 may be tracked over a period of time to determine a user's gaze.

In one example, eye-tracking subsystem 1100 may be configured to identify and measure the inter-pupillary distance (IPD) of a user. In some embodiments, eye-tracking subsystem 1100 may measure and/or calculate the IPD of the user while the user is wearing the artificial reality system. In these embodiments, eye-tracking subsystem 1100 may detect the positions of a user's eyes and may use this information to calculate the user's IPD.

As noted, the eye-tracking systems or subsystems disclosed herein may track a user's eye position and/or eye movement in a variety of ways. In one example, one or more light sources and/or optical sensors may capture an image of the user's eyes. The eye-tracking subsystem may then use the captured information to determine the user's inter-pupillary distance, interocular distance, and/or a 3D position of each eye (e.g., for distortion adjustment purposes), including a magnitude of torsion and rotation (i.e., roll, pitch, and yaw) and/or gaze directions for each eye. In one example, infrared light may be emitted by the eye-tracking subsystem and reflected from each eye. The reflected light may be received or detected by an optical sensor and analyzed to extract eye rotation data from changes in the infrared light reflected by each eye.

The eye-tracking subsystem may use any of a variety of different methods to track the eyes of a user. For example, a light source (e.g., infrared light-emitting diodes) may emit a dot pattern onto each eye of the user. The eye-tracking subsystem may then detect (e.g., via an optical sensor coupled to the artificial reality system) and analyze a reflection of the dot pattern from each eye of the user to identify a location of each pupil of the user. Accordingly, the eye-tracking subsystem may track up to six degrees of freedom of each eye (i.e., 3D position, roll, pitch, and yaw) and at least a subset of the tracked quantities may be combined from two eyes of a user to estimate a gaze point (i.e., a 3D location or position in a virtual scene where the user is looking) and/or an IPD.

In some cases, the distance between a user's pupil and a display may change as the user's eye moves to look in different directions. The varying distance between a pupil and a display as viewing direction changes may be referred to as "pupil swim" and may contribute to distortion perceived by the user as a result of light focusing in different locations as the distance between the pupil and the display changes. Accordingly, measuring distortion at different eye positions and pupil distances relative to displays and generating distortion corrections for different positions and distances may allow mitigation of distortion caused by pupil swim by tracking the 3D position of a user's eyes and applying a distortion correction corresponding to the 3D position of each of the user's eyes at a given point in time. Thus, knowing the 3D position of each of a user's eyes may allow for the mitigation of distortion caused by changes in the distance between the pupil of the eye and the display by applying a distortion correction for each 3D eye position. Furthermore, as noted above, knowing the position of each of the user's eyes may also enable the eye-tracking subsystem to make automated adjustments for a user's IPD.

In some embodiments, a display subsystem may include a variety of additional subsystems that may work in conjunction with the eye-tracking subsystems described herein. For example, a display subsystem may include a varifocal subsystem, a scene-rendering module, and/or a vergence-processing module. The varifocal subsystem may cause left and right display elements to vary the focal distance of the display device. In one embodiment, the varifocal subsystem may physically change the distance between a display and the optics through which it is viewed by moving the display, the optics, or both. Additionally, moving or translating two lenses relative to each other may also be used to change the focal distance of the display. Thus, the varifocal subsystem may include actuators or motors that move displays and/or optics to change the distance between them. This varifocal subsystem may be separate from or integrated into the display subsystem. The varifocal subsystem may also be integrated into or separate from its actuation subsystem and/or the eye-tracking subsystems described herein.

In one example, the display subsystem may include a vergence-processing module configured to determine a vergence depth of a user's gaze based on a gaze point and/or an estimated intersection of the gaze lines determined by the eye-tracking subsystem. Vergence may refer to the simultaneous movement or rotation of both eyes in opposite directions to maintain single binocular vision, which may be naturally and automatically performed by the human eye. Thus, a location where a user's eyes are verged is where the user is looking and is also typically the location where the user's eyes are focused. For example, the vergence-processing module may triangulate gaze lines to estimate a distance or depth from the user associated with intersection of the gaze lines. The depth associated with intersection of the gaze lines may then be used as an approximation for the accommodation distance, which may identify a distance from the user where the user's eyes are directed. Thus, the vergence distance may allow for the determination of a location where the user's eyes should be focused and a depth from the user's eyes at which the eyes are focused, thereby providing information (such as an object or plane of focus) for rendering adjustments to the virtual scene.

The vergence-processing module may coordinate with the eye-tracking subsystems described herein to make adjustments to the display subsystem to account for a user's vergence depth. When the user is focused on something at a distance, the user's pupils may be slightly farther apart than when the user is focused on something close. The eye-tracking subsystem may obtain information about the user's vergence or focus depth and may adjust the display subsystem to be closer together when the user's eyes focus or verge on something close and to be farther apart when the user's eyes focus or verge on something at a distance.

The eye-tracking information generated by the above-described eye-tracking subsystems may also be used, for example, to modify various aspects of how different computer-generated images are presented. For example, a display subsystem may be configured to modify, based on information generated by an eye-tracking subsystem, at least one aspect of how the computer-generated images are presented. For instance, the computer-generated images may be modified based on the user's eye movement, such that if a user is looking up, the computer-generated images may be moved upward on the screen. Similarly, if the user is looking to the side or down, the computer-generated images may be moved to the side or downward on the screen. If the user's eyes are closed, the computer-generated images may be paused or removed from the display and resumed once the user's eyes are back open.

The above-described eye-tracking subsystems can be incorporated into one or more of the various artificial reality systems described herein in a variety of ways. For example, one or more of the various components of system 1000 and/or eye-tracking subsystem 1100 may be incorporated into augmented-reality system 500 in FIG. 5 and/or virtual-reality system 600 in FIG. 6 to enable these systems to perform various eye-tracking tasks (including one or more of the eye-tracking operations described herein).

Figure 12A:
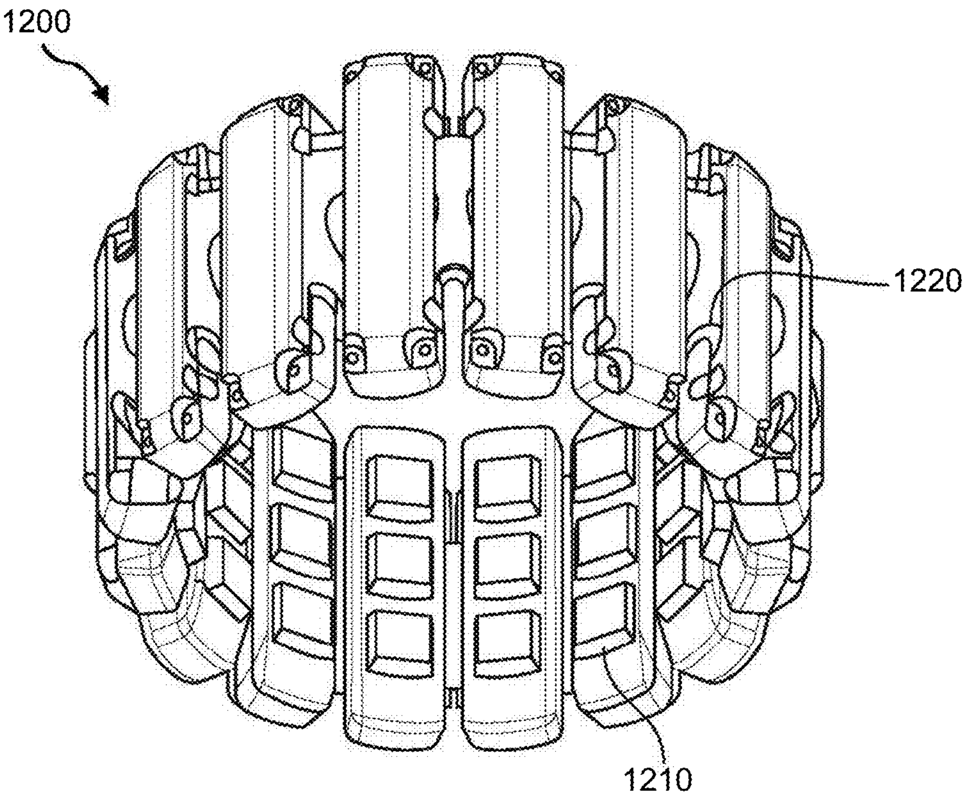
FIGS. 12A and 12B are illustrations of an example human-machine interface configured to be worn around a user's lower arm or wrist.
Figure 12B:
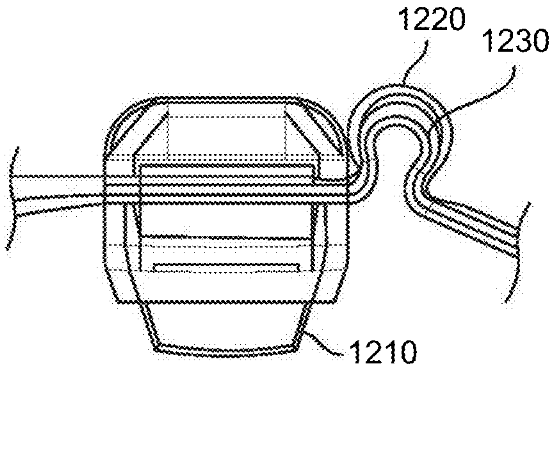

FIG. 12A illustrates an example human-machine interface (also referred to herein as an EMG control interface) configured to be worn around a user's lower arm or wrist as a wearable system 1200. In this example, wearable system 1200 may include sixteen neuromuscular sensors 1210 (e.g., EMG sensors) arranged circumferentially around an elastic band 1220 with an interior surface 1230 configured to contact a user's skin. However, any suitable number of neuromuscular sensors may be used. The number and arrangement of neuromuscular sensors may depend on the particular application for which the wearable device is used. For example, a wearable armband or wristband can be used to generate control information for controlling an augmented reality system, a robot, controlling a vehicle, scrolling through text, controlling a virtual avatar, or any other suitable control task. As shown, the sensors may be coupled together using flexible electronics incorporated into the wireless device. FIG. 12B illustrates a cross-sectional view through one of the sensors of the wearable device shown in FIG. 12A. In some embodiments, the output of one or more of the sensing components can be optionally processed using hardware signal processing circuitry (e.g., to perform amplification, filtering, and/or rectification). In other embodiments, at least some signal processing of the output of the sensing components can be performed in software. Thus, signal processing of signals sampled by the sensors can be performed in hardware, software, or by any suitable combination of hardware and software, as aspects of the technology described herein are not limited in this respect. A non-limiting example of a signal processing chain used to process recorded data from sensors 1210 is discussed in more detail below with reference to FIGS. 13A and 13B.

Figure 13A:
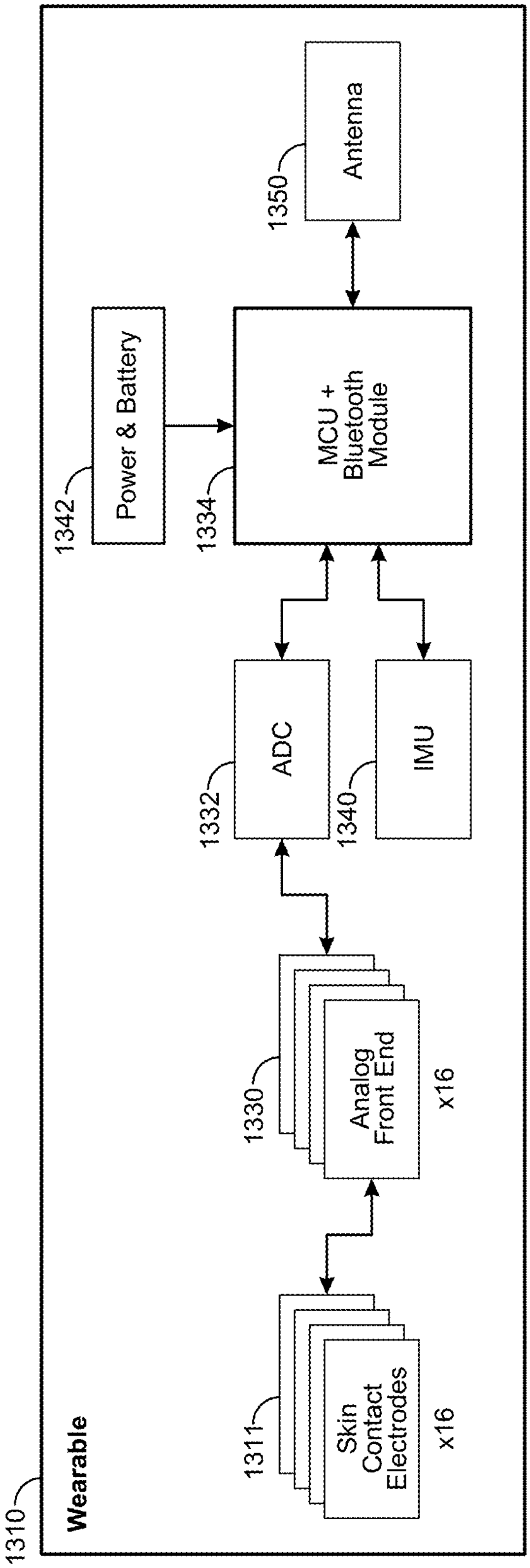
FIGS. 13A and 13B are illustrations of an example schematic diagram with internal components of a wearable system.
Figure 13B:
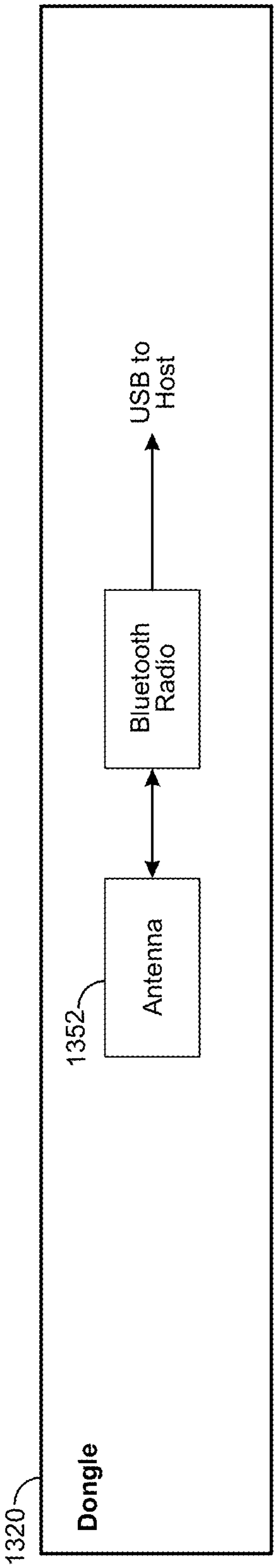

FIGS. 13A and 13B illustrate an example schematic diagram with internal components of a wearable system with EMG sensors. As shown, the wearable system may include a wearable portion 1310 (FIG. 13A) and a dongle portion 1320 (FIG. 13B) in communication with the wearable portion 1310 (e.g., via BLUETOOTH or another suitable wireless communication technology). As shown in FIG. 13A, the wearable portion 1310 may include skin contact electrodes 1311, examples of which are described in connection with FIGS. 12A and 12B. The output of the skin contact electrodes 1311 may be provided to analog front end 1330, which may be configured to perform analog processing (e.g., amplification, noise reduction, filtering, etc.) on the recorded signals. The processed analog signals may then be provided to analog-to-digital converter 1332, which may convert the analog signals to digital signals that can be processed by one or more computer processors. An example of a computer processor that may be used in accordance with some embodiments is microcontroller (MCU) 1334, illustrated in FIG. 13A. As shown, MCU 1334 may also include inputs from other sensors (e.g., IMU sensor 1340), and power and battery module 1342. The output of the processing performed by MCU 1334 may be provided to antenna 1350 for transmission to dongle portion 1320 shown in FIG. 13B.

Dongle portion 1320 may include antenna 1352, which may be configured to communicate with antenna 1350 included as part of wearable portion 1310. Communication between antennas 1350 and 1352 may occur using any suitable wireless technology and protocol, non-limiting examples of which include radiofrequency signaling and BLUETOOTH. As shown, the signals received by antenna 1352 of dongle portion 1320 may be provided to a host computer for further processing, display, and/or for effecting control of a particular physical or virtual object or objects.

Although the examples provided with reference to FIGS. 12A-12B and FIGS. 13A-13B are discussed in the context of interfaces with EMG sensors, the techniques described herein for reducing electromagnetic interference can also be implemented in wearable interfaces with other types of sensors including, but not limited to, mechanomyography (MMG) sensors, sonomyography (SMG) sensors, and electrical impedance tomography (EIT) sensors. The techniques described herein for reducing electromagnetic interference can also be implemented in wearable interfaces that communicate with computer hosts through wires and cables (e.g., USB cables, optical fiber cables, etc.).

The following example embodiments are also included in the present disclosure:

Example 1. An apparatus, including: a package substrate including a plurality of package bonding pads; and a die electrically coupled to the package substrate via a plurality of conductive bonding elements, wherein: the die includes: a first application-specific integrated circuit including first die input/output pads; and a second application-specific integrated circuit including second die input/output pads; each of the first die input/output pads of the first application-specific integrated circuit is electrically coupled to at least one corresponding package bonding pad of the package substrate by at least one of the plurality of conductive bonding elements; and at least one of the second die input/output pads of the second application-specific integrated circuit is not electrically coupled to any package bonding pad of the package substrate such that the second application-specific integrated circuit is left in an inoperable state.

Example 2. The apparatus of Example 1, wherein none of the second die input/output pads of the second application-specific integrated circuit are electrically coupled to any package bonding pad of the package substrate.

Example 3. The apparatus of Example 1 or Example 2, wherein: at least one of the second die input/output pads is configured to deliver power to the second application-specific integrated circuit; and the at least one of the second die input/output pads that is configured to deliver power to the second application-specific integrated circuit is not electrically coupled to a package bonding pad of the package substrate.

Example 4. The apparatus of any one of Examples 1 through 3, wherein: at least one of the second die input/output pads is configured to feedback a voltage level to an external power management chip; and the at least one of the second die input/output pads that is configured to feedback the voltage level to the external power management chip is not electrically coupled to a package bonding pad of the package substrate.

Example 5. The apparatus of any one of Examples 1 through 4, wherein the plurality of package bonding pads includes a package bonding pad corresponding to each of the first die input/output pads and the second die input/output pads.

Example 6. The apparatus of any one of Examples 1 through 4, wherein: the plurality of package bonding pads includes a package bonding pad for each of the first die input/output pads; and the plurality of package bonding pads does not include a package bonding pad for each of the second die input/output pads.

Example 7. The apparatus of any one of Examples 1 through 6, wherein no conductive bonding elements are positioned directly between the second application-specific integrated circuit and the package substrate.

Example 8. The apparatus of any one of Examples 1 through 6, wherein at least one conductive bonding element is positioned directly between the second application-specific integrated circuit and the package substrate.

Example 9. The apparatus of any one of Examples 1 through 4 and 6 through 8, wherein the package substrate lacks package bonding pads for electrically connecting to the second application-specific integrated circuit.

Example 10. The apparatus of any one of Examples 1 through 9, wherein the plurality of conductive bonding elements include at least one of: a plurality of conductive solder bumps, or a plurality of copper pillar bumps.

Example 11. The apparatus of any one of Examples 1 through 10, wherein the second application-specific integrated circuit includes a graphics block, a machine-learning block, or a display block of the die.

Example 12. The apparatus of any one of Examples 1 through 11, wherein the package substrate includes routing layers and a power rail respectively electrically connected to corresponding package bonding pads of the plurality of package bonding pads.

Example 13. A chip package, including: a package substrate including a plurality of package bonding pads; and a die electrically coupled to the package substrate via a plurality of conductive bonding elements, wherein: the die includes a first application-specific integrated circuit including first die input/output pads and a second application-specific integrated circuit including second die input/output pads; each of the first die input/output pads is electrically coupled to at least one corresponding package bonding pad via the plurality of conductive bonding elements; and at least one of the second die input/output pads is not electrically coupled to any package bonding pad such that the second application-specific integrated circuit is left in an inoperable state.

Example 14. The chip package of Example 13, wherein the package substrate lacks any package bonding pads directly under the second application-specific integrated circuit.

Example 15. The chip package of Example 13 or Example 14, wherein no conductive bonding elements are positioned directly between the second application-specific integrated circuit and the package substrate.

Example 16. The chip package of any one of Examples 13 through 15, wherein none of the second die input/output pads of the second application-specific integrated circuit are electrically coupled to any package bonding pad of the package substrate.

Example 17. A head-mounted display, including: a near-eye display; a frame configured to hold the near-eye display on a user's head to present an image or series of images to a user; and a chip package including a package substrate and a die over the package substrate, wherein: the package substrate includes a plurality of package bonding pads; the die includes a first application-specific integrated circuit including first die input/output pads, the first application-specific integrated circuit configured to operate at least one function of the near-eye display, and a second application-specific integrated circuit including second die input/output pads; each of the first die input/output pads is electrically coupled to at least one corresponding package bonding pad of the package substrate by at least one conductive bonding element of a plurality of conductive bonding elements; and at least one of the second die input/output pads is not electrically coupled to any package bonding pad of the package substrate such that the second application-specific integrated circuit is left in an inoperable state.

Example 18. The head-mounted display of Example 17, wherein the first application-specific integrated circuit includes at least one of: a graphics block, a machine-learning block, or a display block of the die.

Example 19. The head-mounted display of Example 17 or Example 18, wherein the plurality of conductive bonding elements includes a plurality of conductive bumps.

Example 20. The head-mounted display of any one of Examples 17 through 19, wherein the at least one of the second die input/output pads that is not electrically coupled to any package bonding pad of the package substrate includes at least one of: a bond pad configured to deliver power to the second application-specific integrated circuit, or a bond pad configured to relay a voltage level of the second application-specific integrated circuit to a power management chip.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The preceding description has been provided to enable others skilled in the art to best utilize various aspects of the example embodiments disclosed herein. This example description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and/or claims, are to be construed as permitting both direct and indirect (i.e., via other elements or components) connection. In addition, the terms "a" or "an," as used in the specification and/or claims, are to be construed as meaning "at least one of." Finally, for ease of use, the terms "including" and "having" (and their derivatives), as used in the specification and/or claims, are interchangeable with and have the same meaning as the word "comprising."

What is claimed is:

1. An apparatus, comprising:

a package substrate comprising a plurality of package bonding pads; and a die electrically coupled to the package substrate via a plurality of conductive bonding elements, wherein:

the die comprises:

a first application-specific integrated circuit comprising first die input/output pads; and a second application-specific integrated circuit comprising second die input/output pads;

each of the first die input/output pads of the first application-specific integrated circuit is electrically coupled to at least one corresponding package bonding pad of the package substrate by at least one of the plurality of conductive bonding elements; and at least one of the second die input/output pads of the second application-specific integrated circuit is not electrically coupled to any package bonding pad of the package substrate such that the second application-specific integrated circuit is left in an inoperable state.

2. The apparatus of claim 1, wherein none of the second die input/output pads of the second application-specific integrated circuit are electrically coupled to any package bonding pad of the package substrate.

3. The apparatus of claim 1, wherein:

at least one of the second die input/output pads is configured to deliver power to the second application-specific integrated circuit; and the at least one of the second die input/output pads that is configured to deliver power to the second application-specific integrated circuit is not electrically coupled to a package bonding pad of the package substrate.

4. The apparatus of claim 1, wherein:

at least one of the second die input/output pads is configured to feedback a voltage level to an external power management chip; and the at least one of the second die input/output pads that is configured to feedback the voltage level to the external power management chip is not electrically coupled to a package bonding pad of the package substrate.

5. The apparatus of claim 1, wherein the plurality of package bonding pads comprises a package bonding pad corresponding to each of the first die input/output pads and the second die input/output pads.

6. The apparatus of claim 1, wherein:

the plurality of package bonding pads comprises a package bonding pad for each of the first die input/output pads; and the plurality of package bonding pads does not include a package bonding pad for each of the second die input/output pads.

7. The apparatus of claim 1, wherein no conductive bonding elements are positioned directly between the second application-specific integrated circuit and the package substrate.

8. The apparatus of claim 1, wherein at least one conductive bonding element is positioned directly between the second application-specific integrated circuit and the package substrate.

9. The apparatus of claim 1, wherein the package substrate lacks package bonding pads for electrically connecting to the second application-specific integrated circuit.

10. The apparatus of claim 1, wherein the plurality of conductive bonding elements comprise at least one of: a plurality of conductive solder bumps, or a plurality of copper pillar bumps.

11. The apparatus of claim 1, wherein the second application-specific integrated circuit comprises a graphics block, a machine-learning block, or a display block of the die.

12. The apparatus of claim 1, wherein the package substrate comprises routing layers and a power rail respectively electrically connected to corresponding package bonding pads of the plurality of package bonding pads.

13. A chip package, comprising:

a package substrate comprising a plurality of package bonding pads; and a die electrically coupled to the package substrate via a plurality of conductive bonding elements, wherein:

the die comprises a first application-specific integrated circuit comprising first die input/output pads and a second application-specific integrated circuit comprising second die input/output pads;

each of the first die input/output pads is electrically coupled to at least one corresponding package bonding pad via the plurality of conductive bonding elements; and at least one of the second die input/output pads is not electrically coupled to any package bonding pad such that the second application-specific integrated circuit is left in an inoperable state.

14. The chip package of claim 13, wherein the package substrate lacks any package bonding pads directly under the second application-specific integrated circuit.

15. The chip package of claim 13, wherein no conductive bonding elements are positioned directly between the second application-specific integrated circuit and the package substrate.

16. The chip package of claim 13, wherein none of the second die input/output pads of the second application-specific integrated circuit are electrically coupled to any package bonding pad of the package substrate.

17. A head-mounted display, comprising:

a near-eye display;

a frame configured to hold the near-eye display on a user's head to present an image or series of images to a user; and a chip package comprising a package substrate and a die over the package substrate, wherein:

the package substrate includes a plurality of package bonding pads;

the die includes a first application-specific integrated circuit comprising first die input/output pads, the first application-specific integrated circuit configured to operate at least one function of the near-eye display, and a second application-specific integrated circuit comprising second die input/output pads;

each of the first die input/output pads is electrically coupled to at least one corresponding package bonding pad of the package substrate by at least one conductive bonding element of a plurality of conductive bonding elements; and at least one of the second die input/output pads is not electrically coupled to any package bonding pad of the package substrate such that the second application-specific integrated circuit is left in an inoperable state.

18. The head-mounted display of claim 17, wherein the first application-specific integrated circuit comprises at least one of: a graphics block, a machine-learning block, or a display block of the die.

19. The head-mounted display of claim 17, wherein the plurality of conductive bonding elements comprises a plurality of conductive bumps.

20. The head-mounted display of claim 17, wherein the at least one of the second die input/output pads that is not electrically coupled to any package bonding pad of the package substrate comprises at least one of: a bond pad configured to deliver power to the second application-specific integrated circuit, or a bond pad configured to relay a voltage level of the second application-specific integrated circuit to a power management chip.

* * * * *